United States Patent
Jang et al.

(10) Patent No.: US 7,633,477 B2
(45) Date of Patent: Dec. 15, 2009

(54) GATE DRIVER USING A MULTIPLE POWER SUPPLIES VOLTAGES AND HAVING A SHIFT RESISTER

(75) Inventors: Yong Ho Jang, Gyeonggi-do (KR); Nam Wook Cho, Gyeonggi-do (KR); Soo Young Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 581 days.

(21) Appl. No.: 11/372,071

(22) Filed: Mar. 10, 2006

(65) Prior Publication Data
US 2006/0290390 A1    Dec. 28, 2006

(30) Foreign Application Priority Data
Jun. 23, 2005    (KR) ...................... 10-2005-0054282

(51) Int. Cl.
*G09G 3/36* (2006.01)
(52) U.S. Cl. ........................................ 345/92; 345/100
(58) Field of Classification Search .................... 345/92, 345/100
See application file for complete search history.

(56) References Cited

U.S. PATENT DOCUMENTS

| | | | | |
|---|---|---|---|---|
| 5,510,748 A | * | 4/1996 | Erhart et al. | 327/530 |
| 5,598,180 A | * | 1/1997 | Suzuki et al. | 345/100 |
| 5,621,439 A | * | 4/1997 | Okada et al. | 345/211 |
| 6,690,347 B2 | * | 2/2004 | Jeon et al. | 345/100 |
| 2003/0080934 A1 | * | 5/2003 | Ishiyama | 345/100 |
| 2003/0231735 A1 | * | 12/2003 | Moon et al. | 377/64 |
| 2004/0109526 A1 | * | 6/2004 | Park et al. | 377/64 |
| 2004/0256636 A1 | * | 12/2004 | Tobita | 257/200 |

* cited by examiner

*Primary Examiner*—Alexander Eisen
*Assistant Examiner*—Matthew Yeung
(74) *Attorney, Agent, or Firm*—Holland & Knight LLP

(57) ABSTRACT

In a gate driver including a plurality of stages sequentially outputting shifted signals, each of the stages includes a first controller for controlling a first node in response to a first scan signal and a second scan signal; a second controller for controlling second and third nodes in response to the first scan signal and a voltage at the first node; and an output unit for selectively outputting one of a plurality of clock signals and a first power supply voltage in response to voltages at the first, second and third nodes, wherein second and third power supply voltages different from each other are switched to be supplied to the second and third nodes.

13 Claims, 13 Drawing Sheets

GATE DRIVER USING A MULTIPLE POWER SUPPLIES VOLTAGES AND HAVING A SHIFT RESISTER

This application claims the benefit of Korean Patent Application No. 10-2005-0054282, filed on Jun. 23, 2005, which is hereby incorporated by reference in its entirety.

BACKGROUND OF THE INVENTION

1. Field of the Invention

The present invention relates to a display device, and more particularly, to a gate driver for a display device.

2. Description of the Related Art

Research has been actively made on display devices, such as liquid crystal display (LCD) or organic electro-luminescence (EL) display device, which can display an image by driving pixels arranged in an active matrix form. Specifically, in the LCD, an image is displayed by providing data signals relating to image information to pixels arranged in an active matrix form and controlling an optical transmittance of a liquid crystal layer is controlled.

The LCD includes a liquid crystal panel with pixels arranged in a matrix, and a driving circuit for driving the liquid crystal panel. In the liquid crystal panel, gate lines and data lines cross one another. Crossings of the date lines with the data lines define pixel regions. A switching thin film transistor (TFT) and a pixel electrode electrically connected to the TFT are provided in each pixel region. The TFT has a gate connected to one of the gate lines, a source connected to one of the data lines, and a drain connected to the pixel electrode.

The driving circuit includes a gate driver for supplying scan signals (e.g., gate signals) to the gate lines, and a data driver for supplying video signals to the data lines. The gate driver supplies the scan signals sequentially to the gate lines to select one line of pixels to be driven during a horizontal period. The data driver supplies the video signals to the selected data line.

An image is displayed on the LCD panel by adjusting the optical transmittance of the liquid crystal layer in accordance with an electric field between the pixel electrode and the common electrode. The applied electric field depends on the video signal applied to each pixel. Thus, an image corresponding to the video signal supplied to each pixel is displayed.

LCDs have been developed with built-in gate driver and/or data driver to reduce manufacturing cost. For example, in forming the TFTs, the gate driver is formed concurrently with the fabrication processes for the TFT. In addition, the data driver may also be built concurrently with the LCD fabrication processes.

FIG. 1 shows a block diagram of a gate driver of an LCD according to the related art. Referring to FIG. 1, the gate driver includes a plurality of stages ST1 to STn for supplying scan signals Vg1 to Vn, respectively. Also, the data driver may include a plurality of stages. The stages ST1 to STn are electrically connected in cascade to an input line that provides a start pulse SP to the first stage ST1. Thus, the first stage is supplied with the start pulse SP. Each of the stages ST1 to STn is also electrically connected to three out of four 4-phase clock signals C1 to C4. Moreover, output terminals of the stages ST1 to STn are electrically connected to the gate lines GL1 to GLn for supplying the scan signals Vg1 to Vgn to the gate lines GL1 to GLn, respectively. Further, the scan signal, one of Vg1 to Vgn, from each of the stages ST1 to STn is also supplied to the next stage. For example, the scan signal Vg1 from stage ST1 is supplied to stage ST2; the scan signal Vg2 from stage ST2 is supplied to stage ST3; and so on.

FIG. 2 is a circuit diagram of the stages illustrated in FIG. 1. Referring to FIG. 2, the first stage ST1 is electrically connected to first, third and fourth clock signals C1, C3 and C4. The first stage ST1 includes a first controller 11 for controlling a non-inverting node Q in response to the start pulse SP and the fourth clock signal C4, a second controller 13 for controlling an inverting node QB in response to the third clock signal C3 and the start pulse SP, and an output unit 15 for selectively outputting one of the first clock signal C1 and a first power supply voltage VSS in response to voltages of the non-inverting node Q and the inverting node QB.

The first controller 11 includes a first transistor T1 diode-connected between the start pulse SP and a second transistor T2. The second transistor T2 provides an electrical path from the diode-connected transistor T1 to a non-inverting node Q. A third transistor T3 provides an electrical path from the non-inverting node Q to the voltage source VSS. The second transistor T2 is controlled by the fourth clock signal C4 applied to a gate of T2. Then, the second transistor T2 controls a voltage at the node Q, which is electrically connected to a gate of an output transistor T6. Thus, the second transistor T2 controls the output transistor T6 at the output unit 15. Accordingly, the first controller 11 controls the output transistor T6 of the output unit 15 through the non-inverting node Q. The output transistor T6 receives the first clock signal C1 as input. Hence, the first clock signal C1 is supplied as the first scan signal Vg1 to the gate line GL1.

The second controller 13 includes a fourth transistor T4 having as input a second power supply voltage VDD. The fourth transistor is controlled by the third clock signal C3 applied to a gate thereof. The output of the fourth transistor T4 is electrically connected to the inverting node QB. The second controller 13 also includes a fifth transistor T5, the gate of which is electrically connected to the start pulse SP. The fifth transistor T5 provides an electrical path between the inverting node QB and the power supply VSS. Thus, the second controller 13 controls the voltage at the inverting node QB through the fourth transistor T4 and a fifth transistor T5 in response to the start pulse SP and the third clock signal C3.

The second controller 13 controls a seventh transistor T7 of the output unit 15 through the inverting node QB, such that the first power supply voltage VSS is supplied as the first scan signal Vg1 to the gate line GL1. The output unit 15 includes: a sixth transistor T6 for switching the first clock signal C1 to be supplied to the gate line GL1 in response to the voltage at the non-inverting node Q; and a seventh transistor T7 for selectively supplying the first power supply voltage VSS to the gate line GL1 in response to the voltage at the inverting node QB.

Also, the first controller 11 further includes a third transistor T3 connected among the non-inverting node Q, the inverting node QB, and the input line of the first power supply voltage VSS. The third transistor T3 operates in a dual mode together with the seventh transistor T7 and controls the inverting node QB.

FIG. 3 is a voltage waveform for the stages illustrated in FIG. 1. As illustrated in FIG. 3, the 4-phase clock signals C1 to C4 are produced by sequentially delaying a phase of a clock signal by one clock period. Using three clock signals of the 4-phase clock signals C1 to C4, each of the stages ST1 to ST4 shifts the start pulse SP by one clock period and outputs the shifted start pulse as the scan signal corresponding to each of the respective stages. For example, the stages ST1 to STn are supplied with the three clock signals C1, C3 and C4 with sequentially delayed phases. Using the inputted clock signals, the stages ST1 to STn sequentially shift the start pulse SP to generate the scan signals Vg1 to Vgn.

As illustrated in FIG. 1, the stages ST1 to STn are connected in cascade to shift an input line of the start pulse, thus generating the scan signals to the gate lines GL. Specifically, the first stage ST1 is supplied with the start pulse SP, and the second to n-th stages ST2 to STn are supplied with the scan signals of their previous stages ST1 to STn−1, respectively.

The first stage ST1 receives the first, third and fourth clock signals C1, C3 and C4 whose phases are sequentially delayed by one clock period. The phase of the fourth clock signal C4 is synchronized with the start pulse SP. The start pulse SP and the first to fourth clock signals C1 to C4 have a voltage swing in a range between −5 V to 20 V. That is, the first to fourth clock signals C1 to C4 have a low voltage section of −5 V and a high voltage section of 20 V in a pulse form. Hereinafter, the low voltage section of −5 V will be referred to as a logic low voltage, and the high voltage section of 20 V will be referred to as a logic high voltage. Also, the first power supply voltage VSS has a negative voltage (−5 V), while the second power supply voltage VDD has a positive voltage (20 V). An operation of the first stage ST1 will be described below with reference to these waveforms.

During a T1 period, when the start pulse SP and the fourth clock signal C4 are simultaneously set to a high logic level, the first and second transistors T1 and T2 are turned on, so that the non-inverting node Q is charged to about 20 V. Thus, the sixth transistor T6 having the gate connected to the non-inverting node Q is gradually turned on. Also, the fifth transistor T5 is turned on by the start pulse SP of a high logic level, so that −5 V supplied through the input line of the first power supply voltage VSS is charged to the non-inverting node QB. Therefore, the third and seventh transistors T3 and T7 having gates connected to the inverting node QB are turned off. Consequently, the low voltage (−5 V) of the first clock signal C1 is supplied to the first gate line GL1 of the first stage ST1 through the turned-on sixth transistor T6, so that the gate line GL1 is charged to the logic low voltage (−5 V).

During a T2 period, the start pulse SP and the fourth clock signal C4 are set to a low logic level and the first clock signal C1 is set to a high logic level. In this case, bootstrapping phenomenon occurs due to the influence of an internal capacitor Cgs formed between the gate and source of the sixth transistor. Thus, a voltage of about 40 V is charged at the non-inverting node Q, so that the non-inverting node Q is perfectly set to the high logic level. The occurrence of the bootstrapping phenomenon is possible because the first to third transistors T1 to T3 are all turned off and thus the non-inverting node Q is in a floating state. Accordingly, the sixth transistor T6 is perfectly turned on, so that the logic high voltage (20 V) of the first clock signal C1 is rapidly charged to the first gate line GL1 connected to the first stage ST1. Thus, the first gate line GL1 is charged to the high logic level of 20 V.

During a T3 period, the first clock signal C1 is set to a low logic level and the second clock signal C2 is set to a high logic level. The voltage at the non-inverting node Q is decreased to about 20 V and the logic low voltage (−5 V) of the first clock signal C1 is charged through the turned-on sixth transistor T6 to the first gate line GL1 of the first stage ST1.

During a T4 period, the third clock signal C3 is set to a high logic level and the fourth transistor T4 is turned on. 20 V of the second power supply voltage VDD is charged at the inverting node QB, so that the third and seventh transistors T3 and T7 are turned on. Therefore, the high voltage of about 20 V charged through the turned-on third transistor T3 to the non-inverting node Q is changed into the logic low voltage of −5 V, and the logic low voltage of −5 V supplied from the input line of the first power supply voltage VSS is charged at the first gate line GL1, so that the scan signal of the low logic level appears at the first gate line GL1. This state is maintained until the start pulse SP and the fourth clock signal are again supplied in the next frame. That is, during the periods of the fourth, first and second clock signals C4, C1 and C2, the logic high voltage is outputted through the sixth transistor T6, and the non-inverting node Q maintains the logic low voltage until the start pulse SP and the fourth clock signal are supplied in the next frame from a time point when the third clock signal C3 is supplied. Also, the logic high voltage is applied to the non-inverting node QB. Consequently, the logic high voltage is maintained at the inverting node QB for most time of one frame. If the gate driver operates in this state for a long time, the seventh transistor T7 having the gate connected to the inverting node QB is degraded. Thus, the characteristics of the transistor are degraded. In a severe case, fatal damage may occur in the transistor such that the transistor does not operate. In this case, an image is poorly displayed, resulting in the degradation of the image quality.

The second stage ST2 has the same structure as that of the first stage ST1. However, the second stage ST2 operates in the same manner as the first stage ST1 by using clocks (e.g., C1, C2, C4) having different phases from the clock signals used in the first stage ST1 by one clock period and the first scan signal Vg1 of the first stage ST1. The first scan signal Vg1 supplied to the second stage ST2 is used for the same purpose as the start pulse SP supplied to the first stage ST1. Consequently, the second stage ST2 outputs the second scan signal Vg2 of the high logic level, which is shifted by one clock period compared to the first stage ST1.

The second to n-th stages ST2 to STn operate in the same manner as the above-describe first stage ST1. Therefore, the second to n-th scan signals Vg2 to Vgn are outputted to the corresponding second to n-th gate lines GL2 to GLn. The second to n-th scan signals Vg2 to Vgn are produced by sequentially shifting the logic high pulse by its width.

Therefore, during one frame, the scan signals Vg1 to Vgn are generated which have the logic high pulse shifted by the stages ST1 to STn connected to the gate lines GL1 to GLn. These procedures are repeated at each frame.

In the gate driver constructed as above, a time (20 μs) necessary to supply the scan signals Vg1 to Vgn of the high logic level to the respective gate lines during one frame period (16.67 ms) is very shortened. On the contrary, the respective gate lines GL1 to GLn supply the scan signals Vg1 to Vgn of the low logic level (−5 V) during most (90% or more) of one frame period. At this point, while the scan signals Vg1 to Vgn of the low logic level are supplied, the logic high voltage is maintained at the gate of the seventh transistor T7. That is, the logic high voltage has to be maintained at the gate of the seventh transistor T7 so as to maintain the logic low voltage at the gate line GL for most of time at every frame. Therefore, due to the repetition of the above procedures, stress voltage is accumulated at the seventh transistor, resulting in degradation.

As illustrated in FIG. 4, the stress voltage is accumulated and increased in each frame. Generally, the LCD displays an image on its screen for at least a few years or several ten years. However, the accumulated stress voltage causes degradation. Due to degradation, a threshold voltage of the seventh transistor T7 increases or decreases, reducing the mobility. Consequently, the device performance is degraded and the operation of the seventh transistor T7 is not correctly controlled. Therefore, the device displays a poor image of low quality. In addition, the LCD has shortened lifetime.

SUMMARY OF THE INVENTION

Accordingly, the present invention is directed to a gate driver that substantially obviates one or more problems due to limitations and disadvantages of the related art.

An object of the present invention is to provide a gate driver that can provide an improved image quality and expanded lifetime by preventing degradation of a stage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, in a gate driver including a plurality of stages sequentially outputting shifted signals, each of the stages includes a first controller for controlling a first node in response to a first scan signal and a second scan signal; a second controller for controlling second and third nodes in response to the first scan signal and a voltage at the first node; and an output unit for selectively outputting one of a plurality of clock signals and a first power supply voltage in response to voltages at the first, second and third nodes, wherein second and third power supply voltages different from each other are switched to be supplied to the second and third nodes.

In another aspect, in a gate driver including a plurality of stages sequentially outputting shifted signals, each of the stages includes a first controller for controlling a first node in response to an output signal from a previous stage and an output signal from a next stage; a second controller for controlling second and third nodes in response to the output signal from the previous stage and a voltage at the first node; and an output unit for selectively outputting one of a plurality of clock signals and a first power supply voltage in response to voltages at the first, second and third nodes, wherein second and third power supply voltages different from each other are switched to be supplied to the second and third nodes.

In another aspect, in a gate driver including a plurality of stages sequentially outputting shifted signals, a respective one of the stages includes a first controller for setting the respective one of the stages, the first controller responsive to a previous output signal from a previous stage and a next output signal from a next stage and applying a first high logic level at a first node of the respective one of the stages during a first time period, and a logic low signal at a second and a third nodes of the respective one of the stages during the first time period; a second controller maintaining the logic low signal at the second and third nodes and applying a second high logic level at the first node in response to the first scan signal and the first high logic level at the first node during a second time period; and an output unit outputting one of a plurality of clock signals during the second time period.

In an other aspect, in a gate driver includes a plurality of stages for sequentially outputting shifted signals and a first controller for controlling the stages. Each of the stages includes an output unit allowing one of logic high and low signals to output in response to signals at first, second and third nodes; and a second controller, responsive to a first scan signal and a second scan signal, for allowing the signal at the first node to be contrarily activated from the signals at the second and third nodes. The first controller enabling the signals at the second and third nodes in each of the stages to be alternatively activated in at least one sequential output period of the gate driver.

In another aspect, a method of driving a gate driver including a plurality of stages sequentially outputting shifted signals includes controlling first to third nodes in each of the stages by an output signal from a previous stage and an output signal from a next stage to enable the first node to be contrarily activated to the second and third nodes; and allowing the second and third nodes in each of the stages to be alternatively activated in at least one sequential output period of the gate driver.

In another aspect, a method of driving a gate including a plurality of stages sequentially outputting shifted signals includes controlling a first node in each of the stages using an output signal from a previous stage and an output signal from a next stage; controlling second and third nodes using the output signal from the previous stage and a voltage at the first node; selectively outputting one of a plurality of clock signals and a first power supply voltage using voltages at the first, second and third nodes; and switching second and third power supply voltages different from each other to be supplied to the second and third nodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
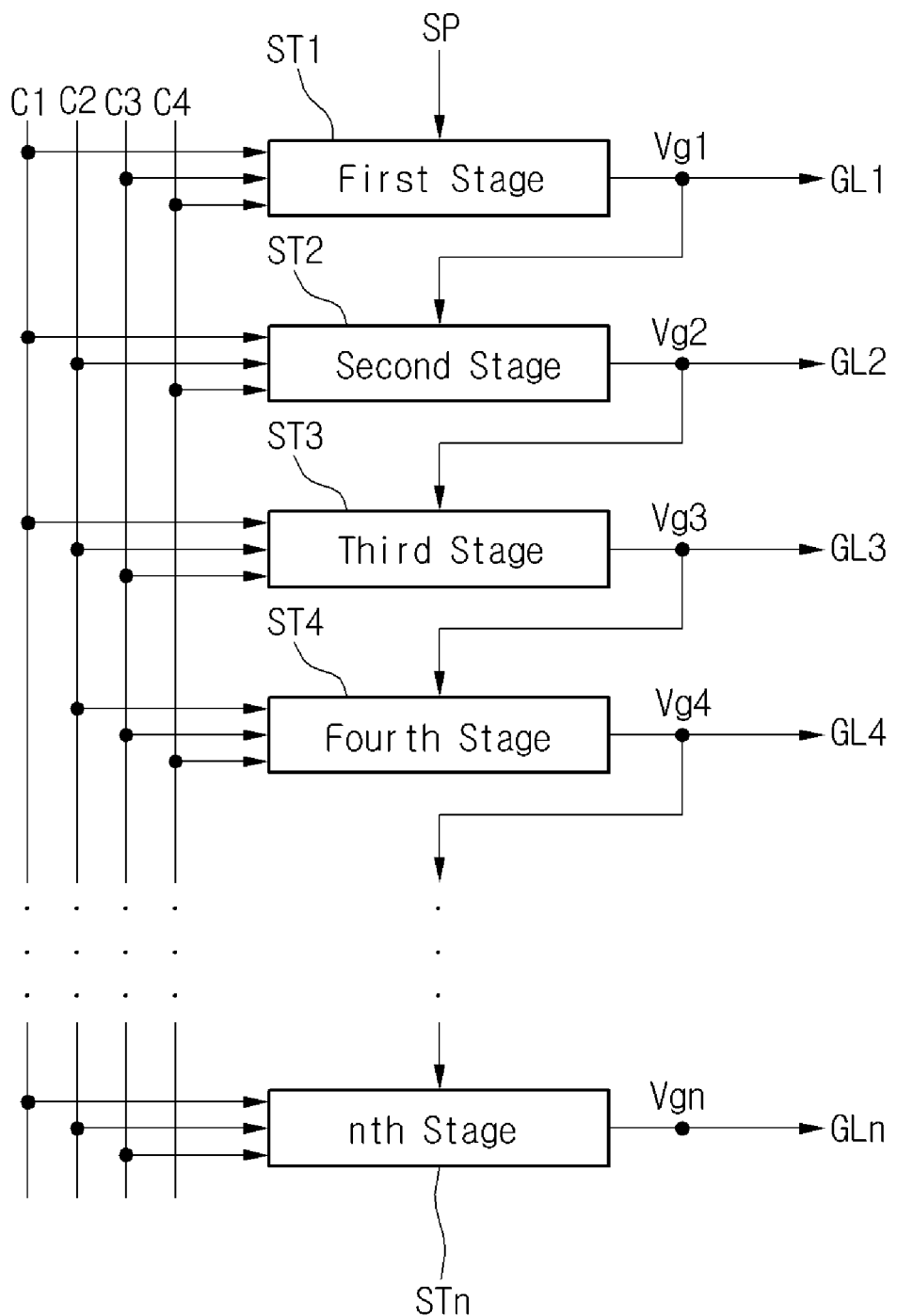
FIG. 1 shows a block diagram of a gate driver of an LCD according to the related art.
Figure 2:
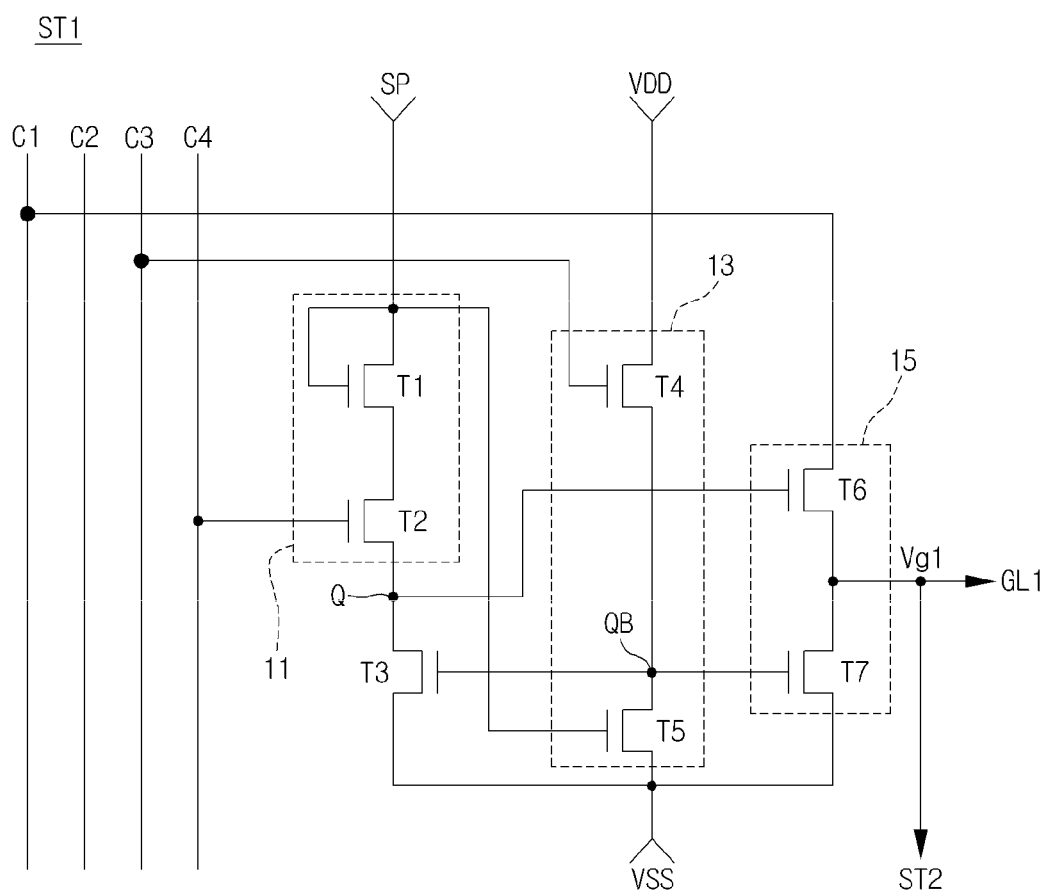
FIG. 2 is a circuit diagram of the stages illustrated in FIG. 1.
Figure 3:
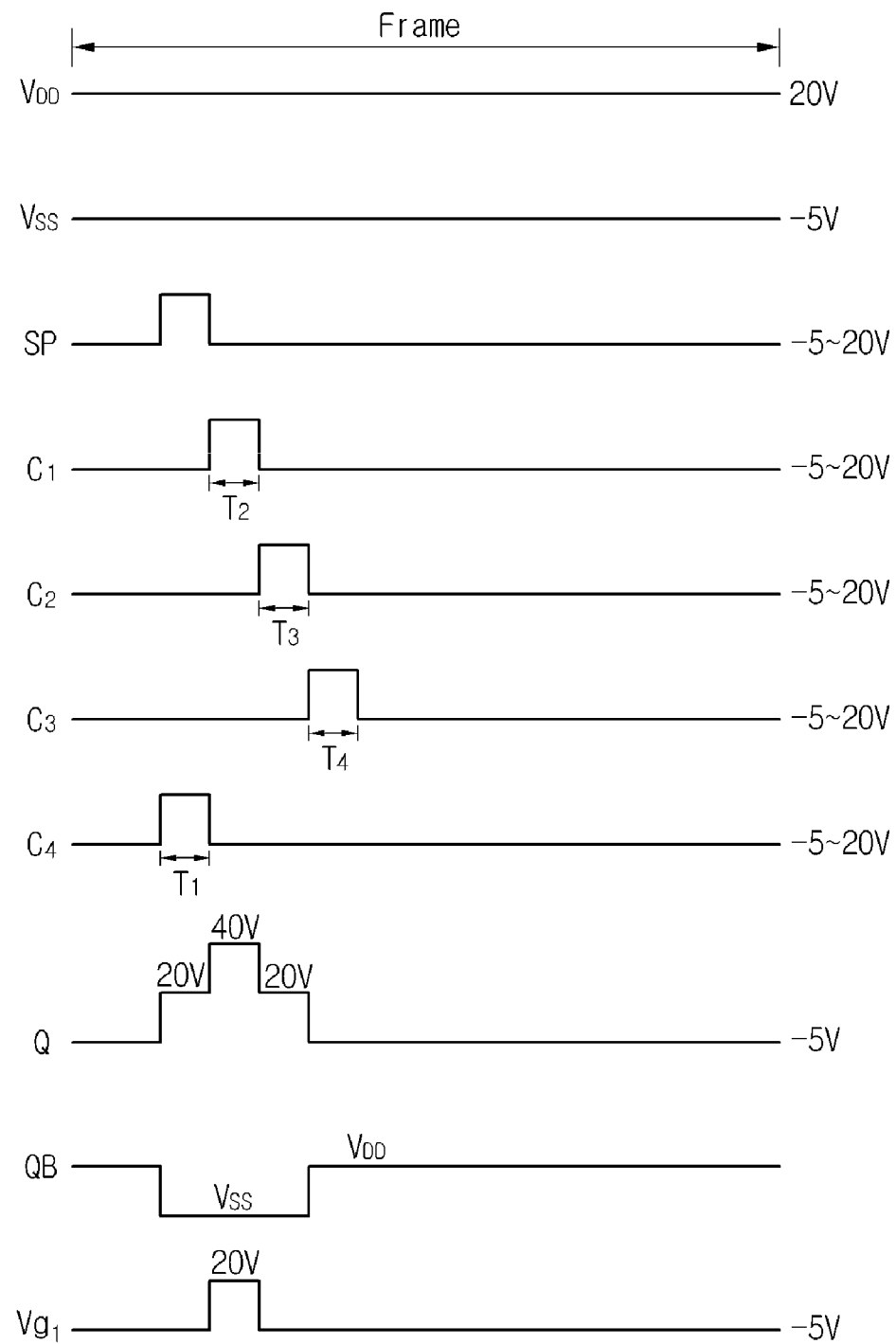
FIG. 3 is a voltage waveform for the stages illustrated in FIG. 1.
Figure 4:
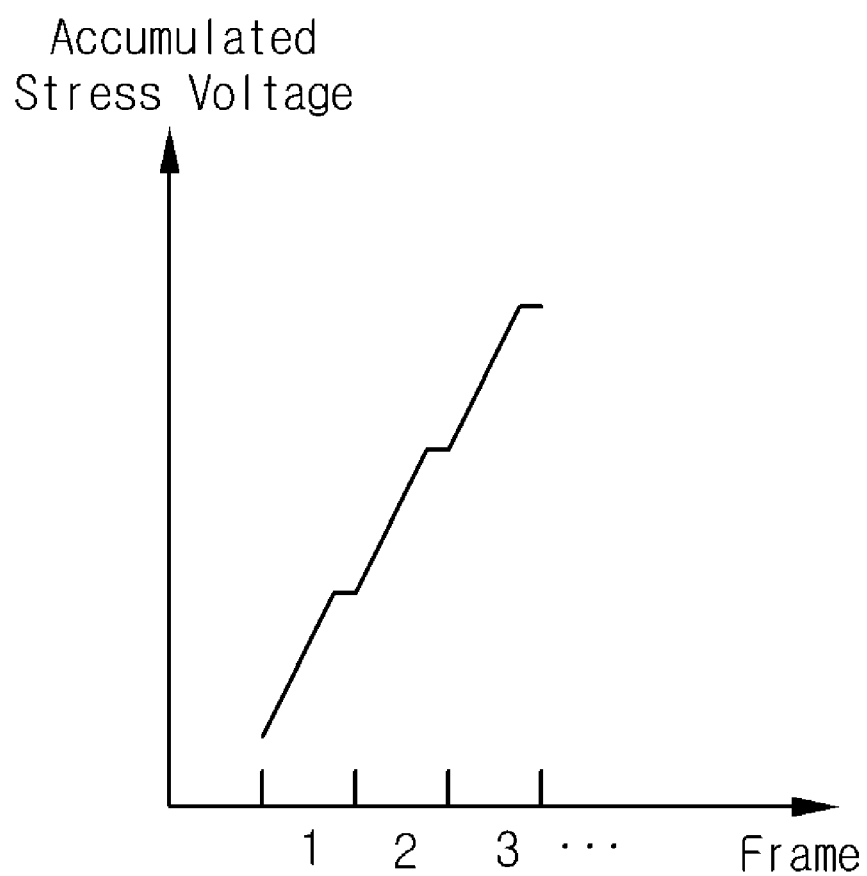
FIG. 4 is a graph of an accumulated stress voltage in the stages of FIG. 1, showing that the accumulated stress voltage increases in frame unit.
Figure 5:
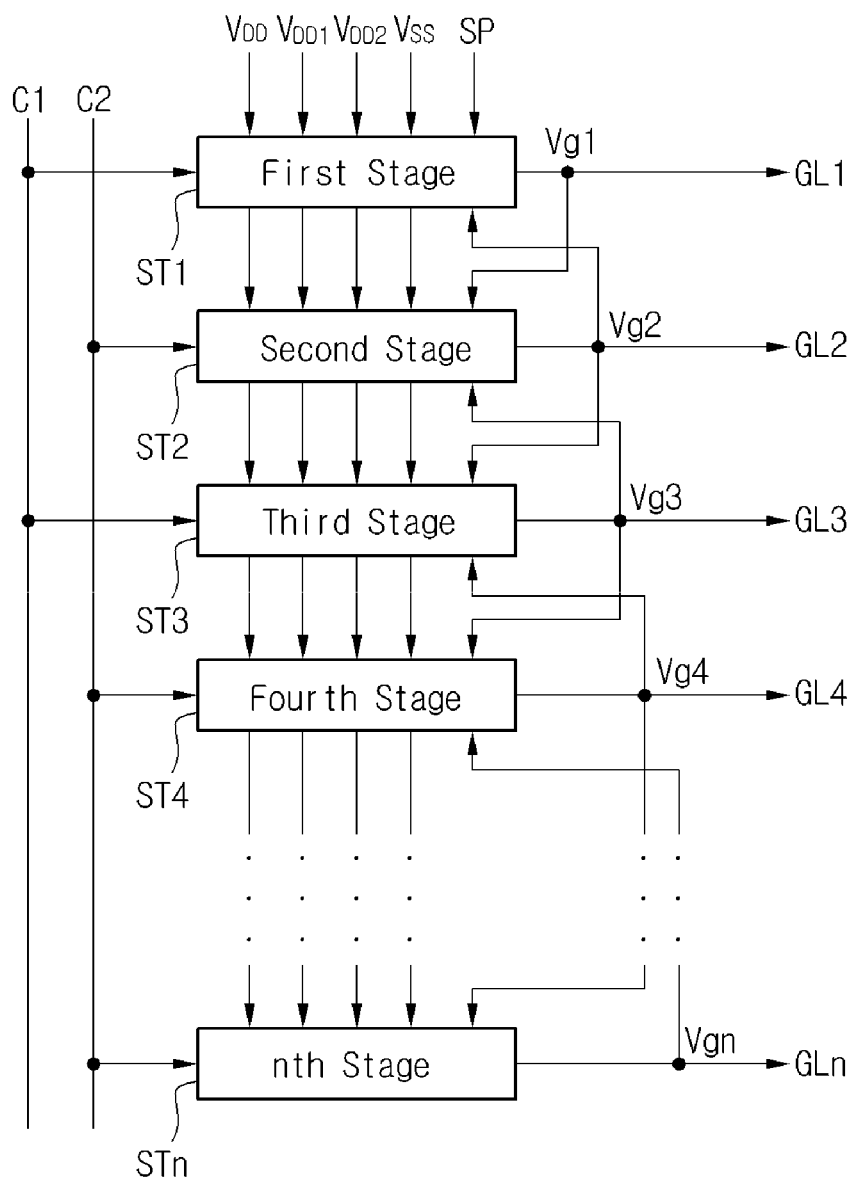
FIG. 5 is a block diagram of an exemplary gate driver for an LCD device according to an embodiment of the present invention.

FIG. 5 is a block diagram of an exemplary gate driver for an LCD device according to an embodiment of the present invention. Referring to FIG. 5, a gate driver of includes a plurality of stages ST1 to STn. The stages ST1 to STn are connected in cascade to input lines of a start pulse SP. Also, each of the stages ST1 to STn is connected to one of two 2-phase clock signals C1 and C2. Thus, in an embodiment of the present invention, only one clock signal is inputted to each stage, unlike the related art gate driver in which two or more clock signals are inputted to each stage. Moreover, although this embodiment is described with respect to the 2-phase clock signals are described, other configurations of the clock signals can be used, for example clock signals having 3 or more phases.

In the case of the 2-phase clock signal as shown in FIG. 5, phases of first and second clock signals C1 and C2 are sequentially delayed by one clock period. For example, the first clock C1, the second clock signal C2, the first clock signal C1, and the second clock signal C2 can be set to logic high in this order.

Each of the stages ST1 to STn is set by the start pulse SP or an output signal of a previous stage and is reset by an output signal of a next stage. Thus, each of the stages ST1 to STn is set by the start pulse SP or an output signal of a previous stage, outputs one of the first and second clock signals C1 and C2 as a scan signal, and is reset by an output signal of a next stage. The previous stage can be the immediately preceding stage. The previous stage can also be a preceding stage other than the immediately preceding stage. Similarly, the next stage can be the immediately following stage. The next stage can also be a following stage other than the immediately following stage.

Figure 6:
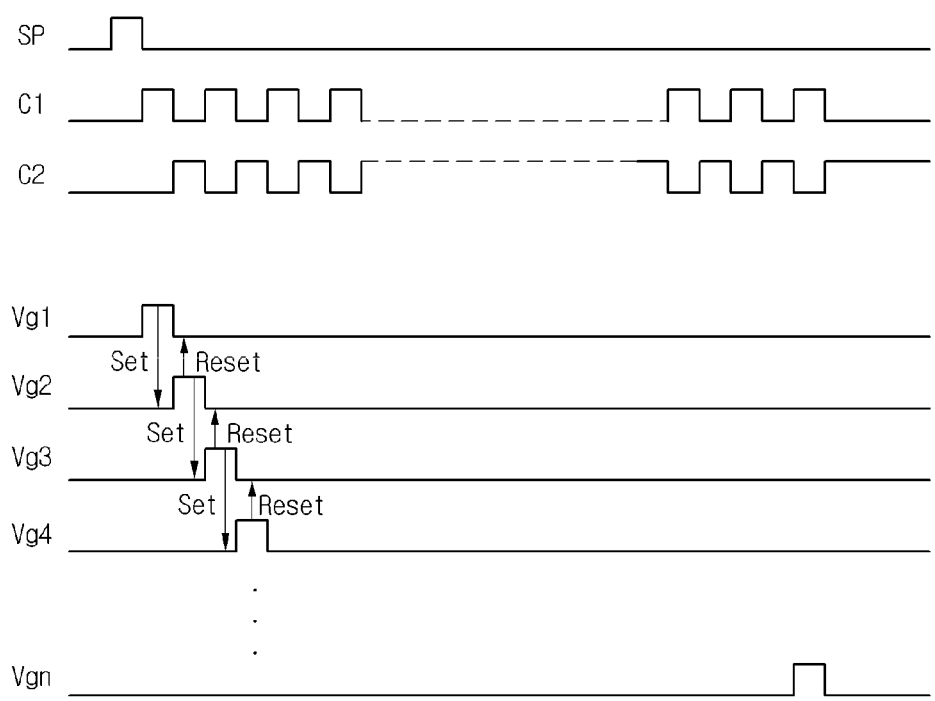
FIG. 6 shows exemplary waveforms of signals for driving the gate driver of FIG. 5.

FIG. 6 shows exemplary waveforms of signals for driving the gate driver of FIG. 5. Referring to FIG. 6, when the first stage ST1 is set by the start pulse SP and the first clock signal C1 is inputted, the first stage ST1 outputs the first clock signal C1 as the first scan signal Vg1. Similarly, the second stage ST2 is set by the first scan signal Vg1. Then, the second stage ST2 outputs the second clock signal C2 as the second scan signal Vg2.

The remaining stages ST3 to STn operate in a similar manner. Specifically, the first scan signal Vg1 of the first stage ST1 is supplied as the start pulse of the next stage ST2. The second scan signal Vg2 of the second stage ST2 is supplied as the start pulse of the next stage ST3. Similarly, the remaining stages ST4 to STn are supplied with the scan signal of their previous stage as the start pulse and generates the scan signal having a logic high pulse a phase of which is shifted by one clock.

Figure 7:
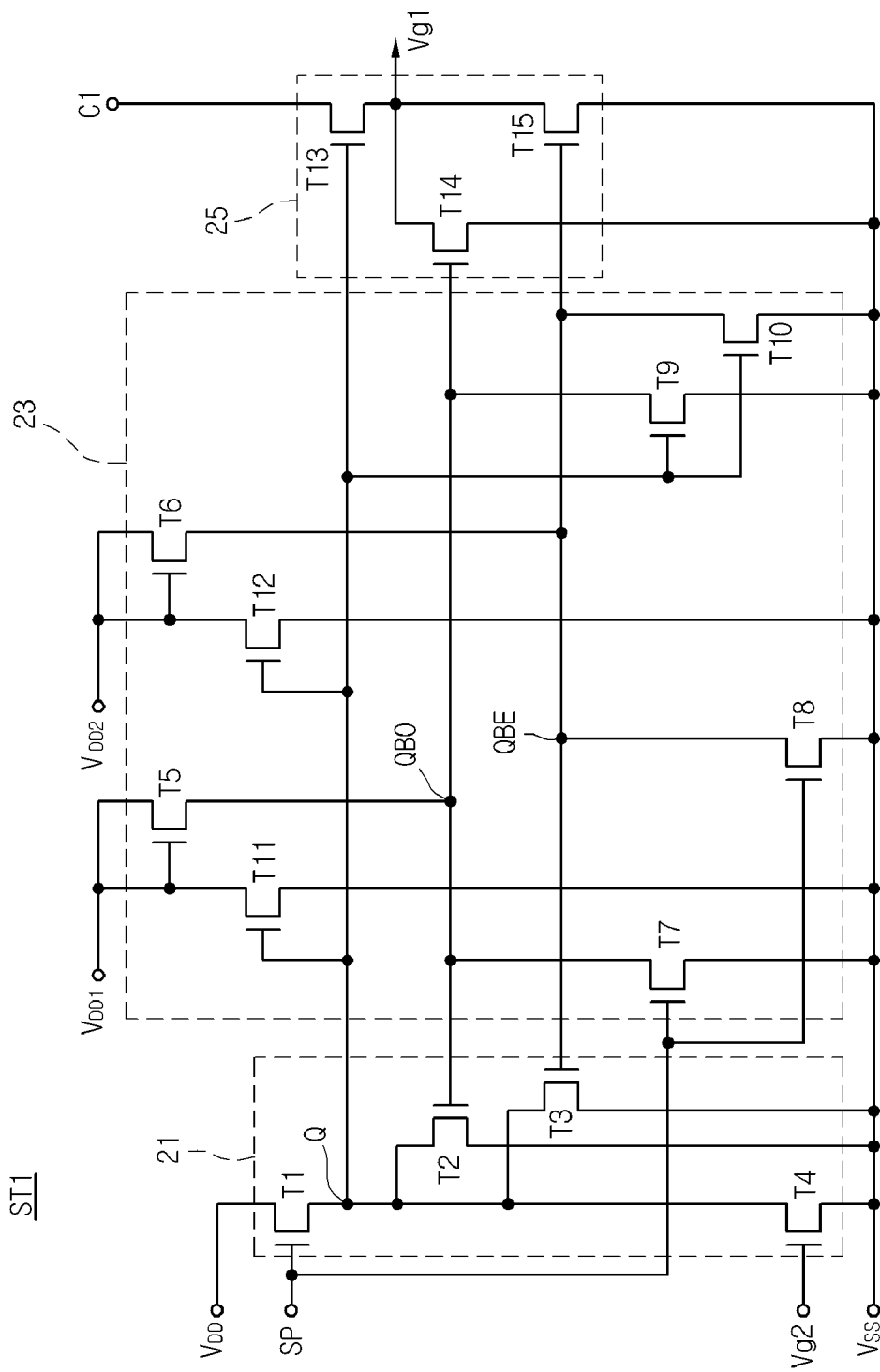
FIG. 7 shows an exemplary circuit diagram of a stage of the gate driver of FIG. 5.

FIG. 7 shows an exemplary circuit diagram of a stage of the gate driver of FIG. 5. Referring to FIG. 7, the first stage ST1 includes a first controller 21 for controlling a non-inverting node Q in response to the start pulse SP and the second scan signal Vg2 of the second stage ST2; a second controller 23 for controlling a first inverting node QBO and a second inverting node QBE in response to the start pulse SP and a voltage at the non-inverting node Q; and an output unit 25 for outputting one of the first clock signal C1 and the first power supply voltage VSS to a corresponding gate line GL1 in response to the voltage at the non-inverting node QBO and voltages of the first and second inverting nodes QBO and QBE.

The first controller 21 controls a transistor T13 of the output unit 25, which is responsive to the voltage at the non-inverting node Q, and supplies the first gate line GL1 with the first clock signal C1 when the scan signal Vg1 has a high level. For this purpose, the first controller 21 is configured with first to fourth transistors T1 to T4. The first transistor T1 has a gate receiving the start pulse SP and a source receiving a second power supply voltage VDD. Also, the first transistor T1 has a drain connected to the non-inverting node Q. The second transistor T2 has a gate connected to the first inverting node QBO, a source connected to the non-inverting node Q, and a drain connected to the input line of the first power supply voltage VSS. The third transistor T3 has a gate connected to the second inverting node QBE, a source connected to the non-inverting node Q, and a drain connected to the input line of the first power supply voltage VSS. The fourth transistor T4 has a gate receiving the second scan signal Vg2 of the next stage ST2, a source connected to the non-inverting node Q, and a drain connected to the input line of the first power supply voltage VSS.

When the first transistor T1 is turned on in response to the start pulse SP, the second power supply voltage VDD is supplied to the non-inverting node Q. In contrast, when the second transistor T2 is turned on by a high voltage at the first inverting node QBO, the first power supply voltage VSS is supplied to the non-inverting node Q. Similarly, when the third transistor T3 is turned on by a high voltage at the second inverting node QBE, the first power supply voltage VSS is supplied to the non-inverting node Q. Moreover, when the second scan signal Vg2 of the next stage ST2 is in a high logic level (that is, a high voltage), the fourth transistor T4 supplies the first power supply voltage VSS to the non-inverting node Q.

Thus, when the start pulse SP is set to a high logic level, the non-inverting node Q is charged to the second power supply voltage VDD. In contrast, when one of the first inverting node QBO, the second inverting node QBE, and the second scan signal Vg2 of the next stage ST2 is set to a high logic level, a discharge operation is performed so that the non-inverting node Q is set to the first power supply voltage.

The second controller 23 enables transistors T14 and T15 of the output unit 25 to switch the first power supply voltage VSS to be supplied to the first gate line GL1 in response to the voltages of the first and second inverting nodes QBO and QBE, so that the scan signal Vg1 of a low logic level selectively appears at the first gate line GL1. For this purpose, the second controller 23 is configured with transistors T5 to T12. The fifth transistor T5 has a gate and a source commonly connected to an input line of a third power supply voltage VDD1, and a drain connected to the first inverting node QBO. The sixth transistor T6 has a gate and a source commonly connected to an input line of a fourth power supply voltage VDD2, and a drain connected to the second inverting node QBE. The seventh transistor T7 has a gate receiving the starting pulse SP, a source connected to the first inverting node QBO, and a drain connected to the input line of the first power supply voltage VSS. The eighth transistor T8 has a gate receiving the start pulse SP, a source connected to the second inverting node QBE, and a drain connected to the first power supply voltage VSS. The ninth transistor T9 has a gate connected to the non-inverting node Q, a source connected to the first inverting node QBO, and a drain connected to the input line of the first power supply voltage VSS. The tenth transistor T10 has a gate connected to the non-inverting node Q, a source connected to the second inverting node QBE, and a drain connected to the first power supply voltage VSS. The eleventh transistor T11 has a gate connected to the non-inverting node Q, a source connected to the input line of the third power supply voltage VDD1, and a drain connected to the input line of the first power supply voltage VSS. The twelfth transistor T12 has a gate connected to the non-inverting node Q, a source connected to the input line of the fourth power supply voltage VDD2, and a drain connected to the input line of the first power supply voltage VSS.

The fifth transistor T5 is powered by voltage difference between the third power supply voltage VDD1 and the first power supply voltage VSS. Likewise, the sixth transistor T6 is powered by a voltage difference between the fourth power supply voltage VDD2 and the first power supply voltage VSS. In this case, the transistor T11 is powered by the voltage difference between VDD1 and the first power supply VSS. Similarly, the transistor T12 is powered by the voltage difference between VDD2 and the first power supply VSS. The eleventh and twelfth transistors T11 and T12 are controlled by the voltage applied at the non-inverting node Q. Therefore, when the voltage at the non-inverting node Q is a high logic level, the eleventh and twelfth transistors T11 and T12 are turned on, so that the first power supply voltage VSS is supplied to the fifth and sixth transistors T5 and T6. The fifth transistor T5 may be controlled by a difference between the third power supply voltage VDD1 and the first power supply voltage VSS, and the sixth transistor T6 may be controlled by a difference between the fourth power supply voltage VSS2 and the first power supply voltage VSS.

The seventh and eighth transistors T7 and T8 are turned on in response to the start pulse SP, so that the first power supply voltage VSS is supplied to the first and second inverting nodes QBO and QBE. The ninth and tenth transistors T9 and T10 are turned on in response to high voltage (that is, high logic level) of the non-inverting node Q, so that the first power supply voltage VSS is supplied to the first and second inverting nodes QBO and QBE.

When the start pulse is in a high logic level, the first power supply voltage VSS passing through the seventh and ninth transistors T7 and T9 are supplied to the first inverting node QBO and simultaneously the third power supply voltage VDD1 passing through the fifth transistor T5 is supplied thereto. Therefore, a logic low signal resulting from the sum of these supplied voltages appears at the first inverting node QBO. Likewise, the first power supply voltage VSS passing through the eighth and tenth transistors T8 and T10 are supplied to the second inverting node QBE and simultaneously the fourth power supply voltage VDD2 passing through the sixth transistor T6 is supplied thereto. Therefore, a logic low signal resulting from the sum of these supplied voltages appears at the second inverting node QBE.

When the second scan signal Vg2 of the next stage is in a high logic level and the start pulse SP is in a low logic level, the first power supply voltage VSS passing through the fourth transistor T4 is supplied to the non-inverting node Q, so that a logic low signal appears at the non-inverting node Q. The eleventh transistor T11 is turned off in response to the logic low signal of the non-inverting node Q, so that the third power supply voltage VDD1 passes through the fifth transistor T5 and is supplied to the first inverting node QBO. Likewise, the twelfth transistor T12 is turned off in response to the logic low signal of the non-inverting node Q, so that the fourth power supply voltage VDD2 passing through the sixth transistor T6 is supplied to the second inverting node QBE.

The output unit 25 selects one of the first clock signal C1 and the first power supply voltage VSS in response to the voltages of the non-inverting node Q, the first inverting node QBO, and the second inverting node QBE, and outputs as the scan signal Vg1 to the first gate line GL1. For this purpose, the output unit 25 is configured with transistors T13 to T15. The thirteenth transistor T13 has a gate connected to the non-inverting node Q, a source connected to the first clock signal C1, and a drain connected to the first gate line GL1. The fourteenth transistor T14 has a gate connected to the first inverting node QBO, a source connected to a contact point between the drain of the thirteenth transistor T13 and the first gate line GL1, and a drain receiving the first power supply voltage VSS. The fifteenth transistor T15 has a gate connected to the second inverting node QBE, a source connected to a contact point between the drain of the thirteenth transistor T13 and the first gate line GL1, and a drain connected to the input line of the first power supply voltage VSS.

The thirteenth transistor T13 is turned on by high voltage (that is, a high logic signal) of the non-inverting node Q, so that the first clock signal C1 is outputted as the scan signal Vg1 to the first gate line GL1. The fourteenth transistor T14 is turned on by high voltage (that is, a high logic signal) of the first inverting node QBO, so that the first power supply voltage VSS is outputted as the scan signal Vg1 to the first gate line GL1. The fifteenth transistor T15 is turned on while high voltage (that is, a high logic signal) appears at the second inverting node QBE, so that the first power supply voltage VSS is outputted as the scan signal Vg1 to the first gate line GL1.

Figure 8:
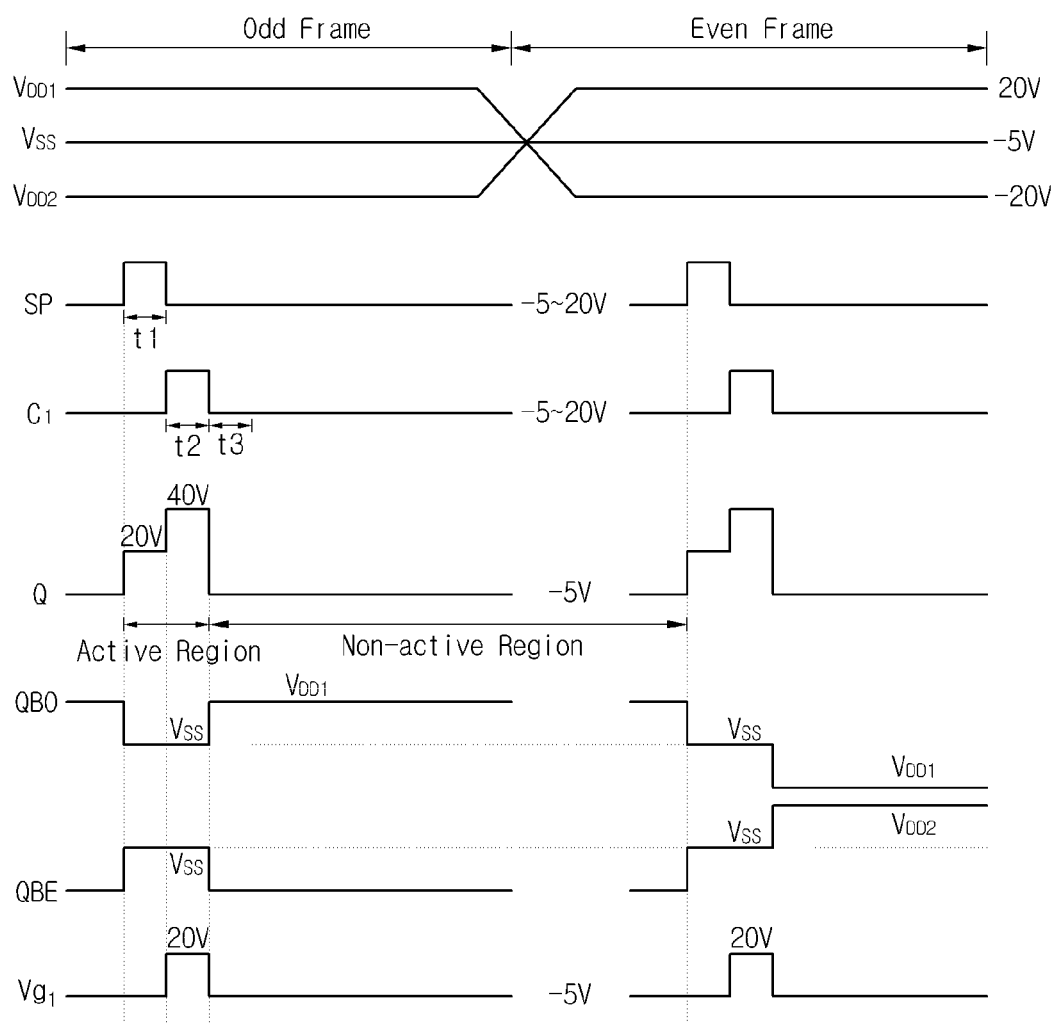
FIG. 8 shows exemplary voltage waveforms for driving the stage shown in FIG. 7.

FIG. 8 shows exemplary voltage waveforms for driving the stage shown in FIG. 7. Referring to FIG. 8, the first power supply voltage VSS maintains a constant low logic level, while the third and fourth power supply voltages VDD1 and VDD2 change their polarities at predetermined periods (for example, after every n-number of frames) with respect to the first power supply voltage VSS. For example, when the inversion period is one frame, the third power supply voltage VDD1 is higher than the first power supply voltage VSS at an odd frame and is lower than the first power supply voltage VSS at an even frames. On the contrary, the fourth power supply voltage VDD2 is lower than the first power supply voltage VSS at the odd frame and is higher than the first power supply voltage VSS at the even frame. Therefore, the third power supply voltage VDD1 maintains a high logic level at the odd frame and a low logic level at the even frame, and the fourth power supply voltage VDD2 maintains a low logic level at the odd frame and a high logic level at the even frame.

The start pulse SP and the first and second clock signals C1 and C2 are about 20 V at the high logic level and −5 V at the low logic level. Also, the second power supply voltage VDD is constantly maintained at the high logic level. Moreover, a low level voltage of either the third power supply voltage VDD1 or the fourth power supply voltage VDD2 are all in a low logic level is equal to or lower than the first power supply voltage VSS.

When the inversion period is one frame, the third and fourth power supply voltages VDD1 and VDD2 may be changed as follows. At the odd frame, the third power supply voltage VSS has a logic high voltage of 20 V, which is higher than the first power supply voltage VSS, and the fourth power supply voltage VDD2 has a logic low voltage of −20 V, which is lower than the first power supply voltage VSS. At the even frame, the third power supply voltage VDD1 has a logic low voltage of −20 V, which is lower than the first power supply voltage VSS, and the fourth power supply voltage VDD2 has a logic high voltage of 20 V, which is higher than the first power supply voltage VSS.

Also, the third power supply voltage VDD1 has a DC voltage regardless of predetermined periods and the fourth power supply voltage VDD2 may be inverted at predetermined periods, and vice versa.

An operation of the stages will be described below with reference to these waveforms. During a first period t1, the start pulse SP is applied with a high level, the first transistor T1 is turned on by the start pulse, so that the second power supply voltage VDD of a high logic level is charged to the non-inverting node Q. Also, the seventh and eighth transistors T7 and T8 are turned on by the start pulse SP, so that the first power supply voltage is supplied to the first and second inverting nodes QBO and QBE. The ninth and tenth transistors T9 and T10 are turned on in response to the high logic signal applied at the non-inverting node Q, so that the first power supply voltage VSS is supplied to the first and second inverting nodes QBO and QBE. In addition, the eleventh and twelfth transistors T11 and T12 are turned on in response to the high logic signal (that is, the second power supply voltage VDD) applied at the non-inverting node Q, so that the first power supply voltage VSS is supplied to the gates of the fifth and sixth transistors T5 and T6. Therefore, the fifth and sixth transistors T5 and T6 are turned off, thus interrupting the supply of the third and fourth power supply voltages VDD1 and VDD2 to the first and second inverting nodes QBO and QBE.

Therefore, during the first period t1, the second power supply voltage VDD of the high logic level is charged at the non-inverting node Q, and the first power supply voltage VSS corresponding to the logic low signal appears at the first and second inverting nodes QBO and QBE. Consequently, the first stage ST1 is set by the start pulse SP.

During a second period t2, that is, when the first clock signal C1 of a high logic level is applied, the start pulse SP is a low logic level. Therefore, the first, seventh and eighth transistors T1, T7 and T8 are turned off, and the first clock signal C1 is inputted to the source of the thirteenth transistor T13. Since the non-inverting node Q has a floating state, the second power supply voltage VDD of the previous high logic level is maintained. Likewise, the first and second inverting nodes QBO and QBE also maintain the previous states. In this case, bootstrapping phenomenon occurs due to the influence of an internal capacitor Cgs formed between the gate and source of the thirteenth transistor T13, and thus the high logic signal at the non-inverting node Q is bootstrapped to about 40 V. The occurrence of the bootstrapping phenomenon is possible because the first to fourth transistors T1 to T4 are all turned off and thus the non-inverting node Q is in a floating state. The thirteenth transistor T13 responsive to the high logic signal at the bootstrapped non-inverting node Q is outputted as the first scan signal Vg1 to the first gate line GL1, without attenuating the first clock signal C1 of 20 V. At this point, the next stage ST2 is set by the first scan signal Vg1 of the high logic level.

During a third period t3, that is, when the second clock signal C1 of a low logic level is applied and the second scan signal Vg2 (not shown) of a high logic level is outputted from the next stage ST2, the first stage ST1 is reset. The second scan signal Vg2 of the high logic level charges the gate line GL2 connected to the output terminal of the next stage (that is, the second stage ST2). Also, the second scan signal Vg2 is inputted to the fourth transistor T4 of the first stage ST1. The fourth transistor T4 is turned on in response to the scan signal Vg2 of the high logic level, which is outputted from the next stage ST2. Therefore, the high logic signal (that is, the high voltage) at the non-inverting node Q is discharged, so that a logic low signal corresponding to the first power supply voltage VSS of the logic low signal appears at the non-inverting node Q. Since the ninth to twelfth transistors T9 to T12 are turned off in response to the logic low signal of the non-inverting node Q, the third power supply voltage VDD1 is supplied through the fifth transistor T5 to the first inverting node QBO. Also, the fourth power supply voltage VDD2 is supplied through the sixth transistor T6 to the second inverting node QBE. In other words, the high logic signal appears at one of the first and second inverting nodes QBO and QBE, while the logic low signal appears at the non-inverting node Q. Therefore, the first scan signal Vg1 of the high logic level at the gate line GL1 is discharged through one of the fourteenth and fifth transistors T14 and T15, so that it is reset to have a low logic level corresponding to the first power supply voltage VSS. Such a state is maintained until the start pulse SP is applied at the next stage.

In this case, the first and second periods t1 and t2 may be defined as an active interval, and an interval to the next frame including the third period t3 may be defined as a non-active interval.

The third and fourth power supply voltages VDD1 and VDD2 may be inverted at predetermined intervals. Assuming that the inversion period is one frame, the third and fourth power supply voltages VDD1 and VDD2 may be changed as follows. During the odd frame, the third power supply voltage VDD1 maintains a logic high state and the fourth power supply voltage VDD2 maintains a logic low state. During the even frame, the third power supply voltage VDD1 maintains a logic low state and the fourth power supply voltage VDD2 maintains a logic high state. The logic low state has a voltage level that is equal to or lower than the first power supply voltage VSS.

In this case, during the non-active interval of the odd frame, the third power supply voltage VDD1 of the high logic level is supplied to the first inverting node QBO, and the fourth power supply voltage VDD2 of the low logic level is supplied to the second inverting node QBE. During the non-active interval of the even frame, the third power supply voltage VDD1 of the low logic level is supplied to the first inverting node QBO, and the fourth power supply voltage VDD2 of the high logic level is supplied to the second inverting node QBE.

When the gate driver operates at every frame in this manner, the logic high voltage and the logic low voltage are alternately supplied to the first inverting node QBO and the second inverting node QBE. Since the logic high voltage and the logic low voltage are alternately supplied to the first inverting node QBO and the second inverting node QBE, it is possible to prevent the accumulation of the stress voltage at the gates of the fourteenth and fifteenth transistors T14 and T15 of the output unit. Consequently, the occurrence of the degradation can be fundamentally prevented. Accordingly, the fourteenth and fifth transistors T14 and T15 connected to the first and second inverting nodes QBO and QBE are stably operated, thereby providing the improved image quality and expanded lifetime.

Figure 9A:
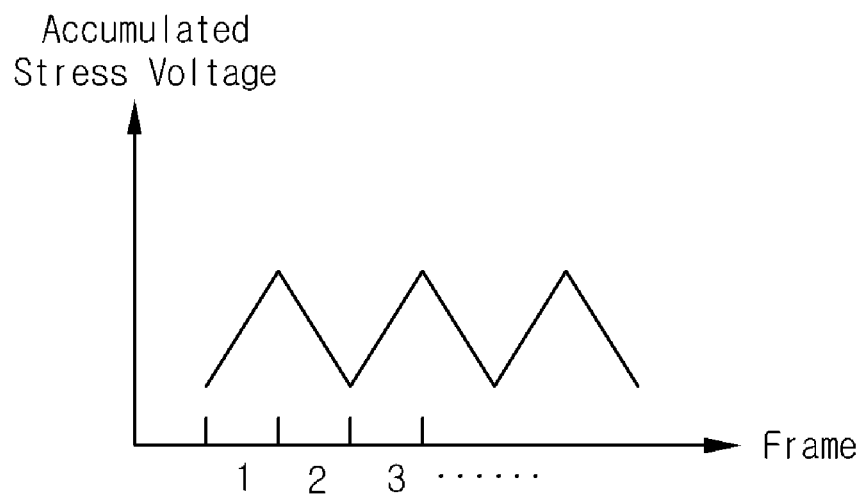
FIGS. 9A and 9B show graphs illustrating exemplary accumulated stress voltages in the stage depicted in FIG. 7.
Figure 9B:
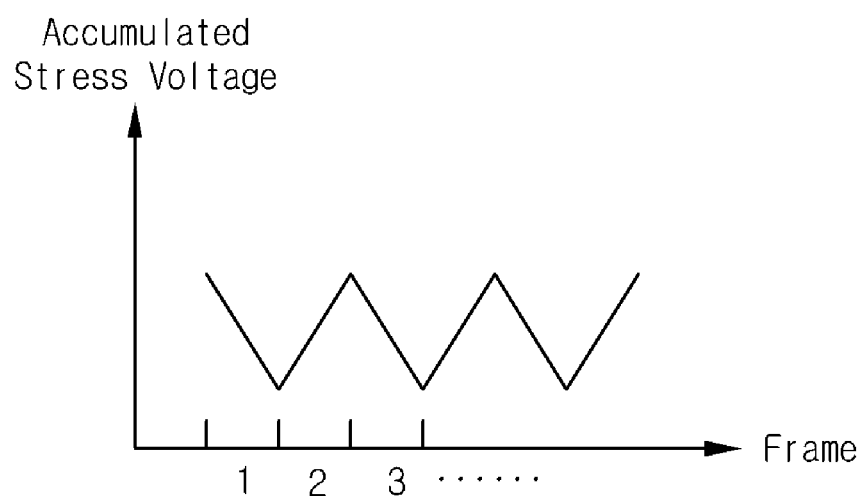

FIGS. 9A and 9B show graphs illustrating exemplary accumulated stress voltages in the stage depicted in FIG. 7. As can be seen from FIG. 9A, the accumulated stress voltage at the first inverting node QBO is increased by the third power supply voltage VDD1 of the high logic level during the first frame, and is decreased by the third power supply voltage VDD1 of the low logic level during the second frame. Then, the accumulated stress voltage at the first inverting node QBO is increased and decreased during the third and fourth frames, respectively. By repeating these procedures at every frame, the average value of the accumulated stress voltage becomes "0".

As can be seen from FIG. 9B, the accumulated stress voltage at the second inverting node QBE is decreased by the fourth power supply voltage VDD2 of the low logic level during the first frame, and is increased by the fourth power supply voltage VDD2 of the high logic level during the second frame. The accumulated stress voltage at the second inverting node QBE is then charged and thus increased. Thereafter, the accumulated stress voltage at the second inverting node QBE is again decreased and increased during the third and fourth frames, respectively. By repeating these procedures at every frame, the average value of the accumulated stress voltage becomes "0". Since the accumulated stress voltages become "0" at both the first inverting node QBO and the second inverting node QBE, the fourteenth and fifteenth transistors T14 and T15 connected to the first and second inverting nodes QBO and QBE are not degraded.

Figure 10:
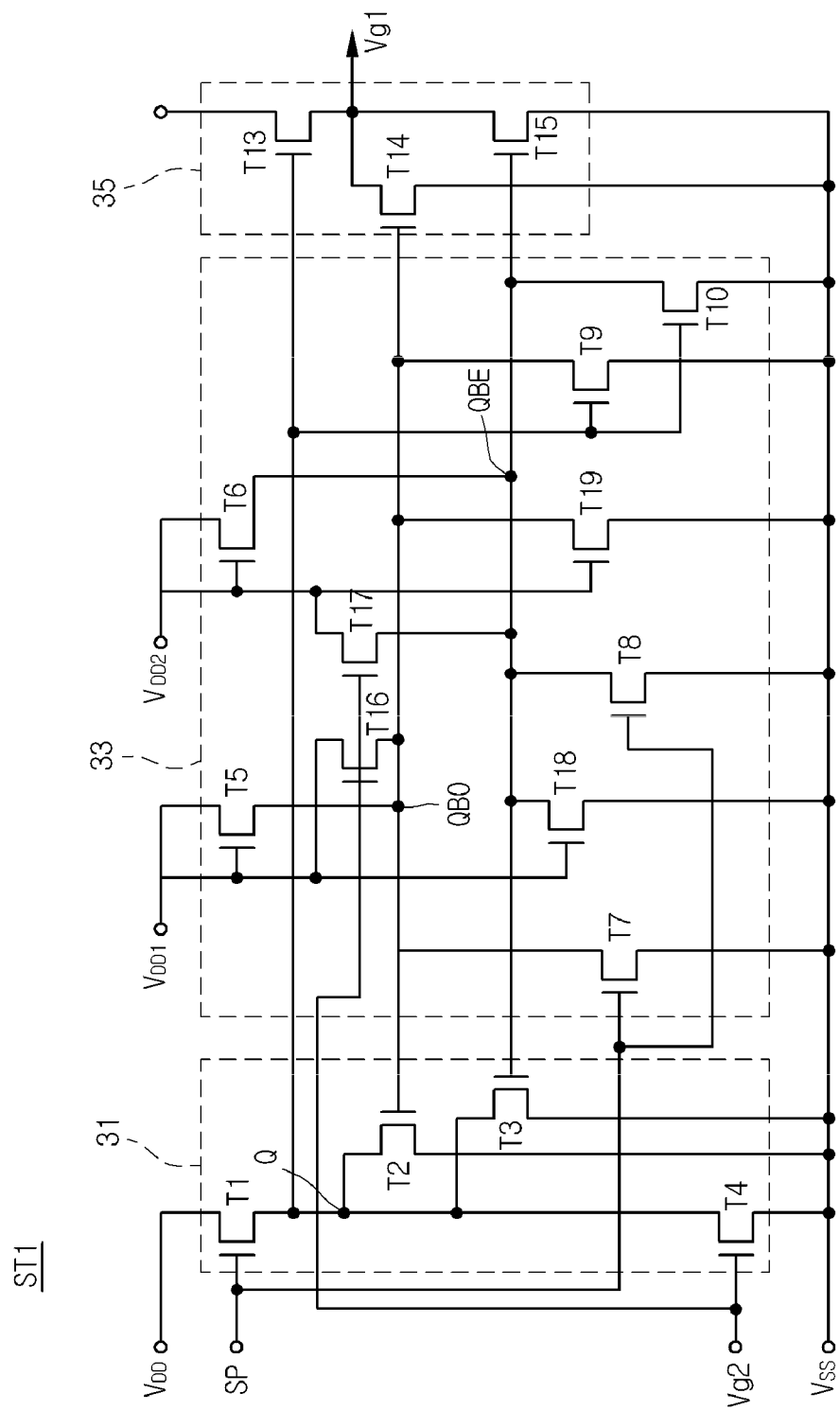
FIG. 10 is a circuit diagram of a stage of the gate driver according to another embodiment of the present invention.

FIG. 10 is a circuit diagram of a stage of a gate driver according to another embodiment of the present invention. The circuit diagram depicted in FIG. 10 is an exemplary modified stage from FIG. 7. Since an operation waveform of the modified stage is similar to that of FIG. 8, its detailed description will be made with reference to FIG. 8. Moreover, portions of FIG. 10 that are similar to corresponding portions of FIG. 7 will be not further described.

Referring to FIG. 10, the stage of the present invention includes a first controller 31, a second controller 33, and an output unit 35. The first controller 31 is configured with first to fourth transistors T1 to T4. Since the first controller 31 has a substantially identical function to that of the first embodiment, a detailed description will be omitted. The output unit 35 is configured with thirteenth to fifth transistors T13 and T15. For the same reason, a detailed description about the output unit 35 will be omitted.

The second controller 33 is configured with fifth to twelfth transistors T5 to T12. If necessary, the second controller 33 may further include sixteenth and seventeenth transistors T16 and T17. Due to the sixteenth and seventeenth transistors T16 and T17 controlled by the scan signal Vg2 of the next stage, the third and fourth power supply voltages VDD1 and VDD2 can be rapidly supplied to the first and second inverting nodes QBO and QBE. A detailed description about them will be made later. Since functions of fifth to tenth transistors T5 to T10 are identical to that of the first embodiment, a detailed description thereof will be omitted.

The sixteenth transistor T16 has a gate receiving the scan signal Vg2 from the next stage ST2, a source connected to the third power supply voltage VDD1, and a drain connected to the first inverting node QBO. The seventeenth transistor T17 has a gate receiving the scan signal Vg2 from the next stage ST2, a source receiving the fourth power supply voltage VDD2, and a drain connected to the second inverting node QBE.

Furthermore, the second controller 33 may include an eighteen and a nineteen transistors T18 and T19. The eighteenth transistor T18 has a gate connected to the third power supply voltage VDD1, a source connected to the second inverting node QBE, and a drain receiving the first power supply voltage VSS. The nineteenth transistor T19 has a gate connected to an input line of the fourth power supply voltage VDD2, a source connected to the first inverting node QBO, and a drain connected to an input line of the first power supply voltage VSS.

During a first period t1, the first, seventh and eighth transistors T1, T7 and T8 are turned on, so that the second power supply voltage VDD is supplied to the non-inverting node Q, while the first power supply voltage VSS is supplied to the first and second inverting nodes QBO and QBE. Also, the ninth and tenth transistors T9 and T10 are turned on by the second power supply voltage VDD applied at the non-inverting node Q, so that the first power supply voltage VSS is supplied to the first and second inverting nodes QBO and QBE. Also, the turn-on/off of the fifth, sixth, eighteenth and nineteenth transistors T5, T6, T18 and T19 is determined by the voltage states of the third and fourth power supply voltages VDD1 and VDD2.

As illustrated in FIG. 8, the third and fourth power supply voltages VDD1 and VDD2 are inverted at each frame. For example, when the third power supply voltage VDD1 is higher than the first power supply voltage VSS and the fourth power supply voltage VDD2 is lower than the first power supply voltage VSS, the fifth and eighteenth transistors T5 and T18 are turned on by the third power supply voltage VDD1, while the sixth and nineteenth transistors T6 and T19 are not turned on. Therefore, the third power supply voltage VDD1 is supplied only to the first inverting node QBO, and the first power supply voltage VSS is supplied through the eighteenth transistor T18 to the second inverting node QBE. On the contrary, when the third power supply voltage VDD1 is lower than the first power supply voltage VSS and the fourth power supply voltage VDD2 is higher than the first power supply voltage VSS, the sixth and nineteenth transistors T6 and T19 are turned on. Thus, the fourth power supply voltage VDD2 is supplied to the second inverting node QBE and the first power supply voltage VSS is supplied through the nineteenth transistor T19 to the first inverting node QBO.

Therefore, during the first period t1, the non-inverting node Q is charged to the second power supply voltage VDD of the high logic level, and the first and second inverting nodes QBO and QBE are discharged to the first power supply voltage VSS of the low logic level. Consequently, the first stage ST1 is set by the start pulse SP.

During a second period t2, the first to fourth transistors T1 to T4 are turned off, so that the non-inverting node Q has a floating state. Therefore, the non-inverting node Q maintains the second power supply voltage VDD of the high logic level, and the first and second inverting nodes QBO and QBE also maintain the previous states. Also, bootstrapping phenomenon occurs due to the influence of an internal capacitor Cgs formed between the gate and source of the thirteenth transistor T13. Therefore, the non-inverting node Q is charged to about 40 V, so that the first clock signal C1 of the high logic level is outputted as the first scan signal Vg1. At this point, the next stage ST2 is set by the first scan signal Vg1 of the high logic level.

During a third period t3, the fourth transistor T4 is turned on in response to the second scan signal Vg2 outputted from the next stage ST2, so that the non-inverting node Q of the high logic level is discharged to the first power supply voltage VSS of the low logic level. The ninth and tenth transistors T9 and T10 are turned off by the logic low voltage at the non-inverting node Q. Also, the third power supply voltage VDD1 higher than the first power supply voltage VSS is supplied to the first inverting node QBO, and the fourth power supply voltage VDD2 lower than the first power supply voltage VSS is supplied to the second inverting node QBE. Meanwhile, the sixteenth and seventeenth transistors T16 and T17 are turned on in response to the scan signal Vg2 of the next stage ST2. Therefore, the third power supply voltage VDD1 higher than the first power supply voltage VSS is supplied through the sixteenth transistor T16 to the first inverting node QBO. The fourth power supply voltage lower than the first power supply voltage VSS is supplied through the seventeenth transistor T17 to the second inverting node QBE. Accordingly, the first and second inverting nodes QBO and QBE can be charged and discharged more rapidly by the transistors T16 to T19.

In accordance with an embodiment of the present invention, the first and second inverting nodes QBO and QBE can be charged and discharged more rapidly by adding some transistors T16, T17, T18 and T19, thereby preventing the degradation due to the accumulated stress voltage.

Figure 11:
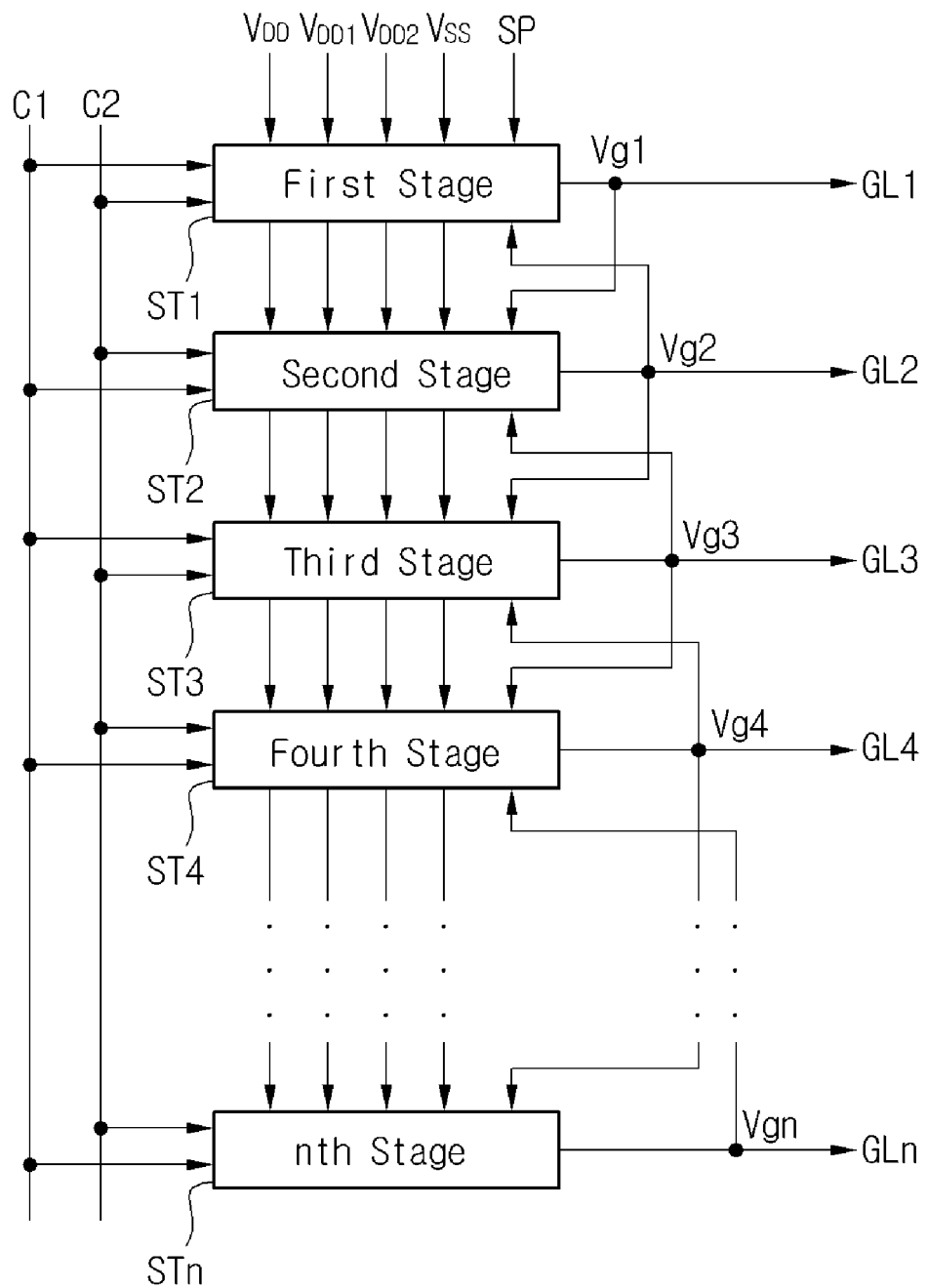
FIG. 11 is a block diagram of an exemplary gate driver for an LCD device according to another embodiment of the present invention.

FIG. 11 is a block diagram of an exemplary gate driver for an LCD device according to another embodiment of the present invention. The gate driver of FIG. 11 is similar to the gate driver of FIG. 5, but the stages ST1 to STn are responsive to two 2-phase clock signals C1 and C2. Each of the stages ST1 to STn is set by the start pulse SP or an output signal of a previous stage and is reset by an output signal of a next stage. Thus, each of the stages ST1 to STn is set by the start pulse SP or an output signal of a previous stage or in synchronization with one of the first and second clock signals C1 and C2, and outputs one of the first and second clock signals C1 and C2 as a scan signal. Also, each of the stages ST1 to STn is reset by an output signal of a next stage or in synchronization with one of the second and first clock signals C2 and C1. The previous stage can be the immediately preceding stage. The previous stage can also be a preceding stage other than the immediately preceding stage. Similarly, the next stage can be the immediately following stage. The next stage can also be a following stage other than the immediately following stage.

Figure 12:
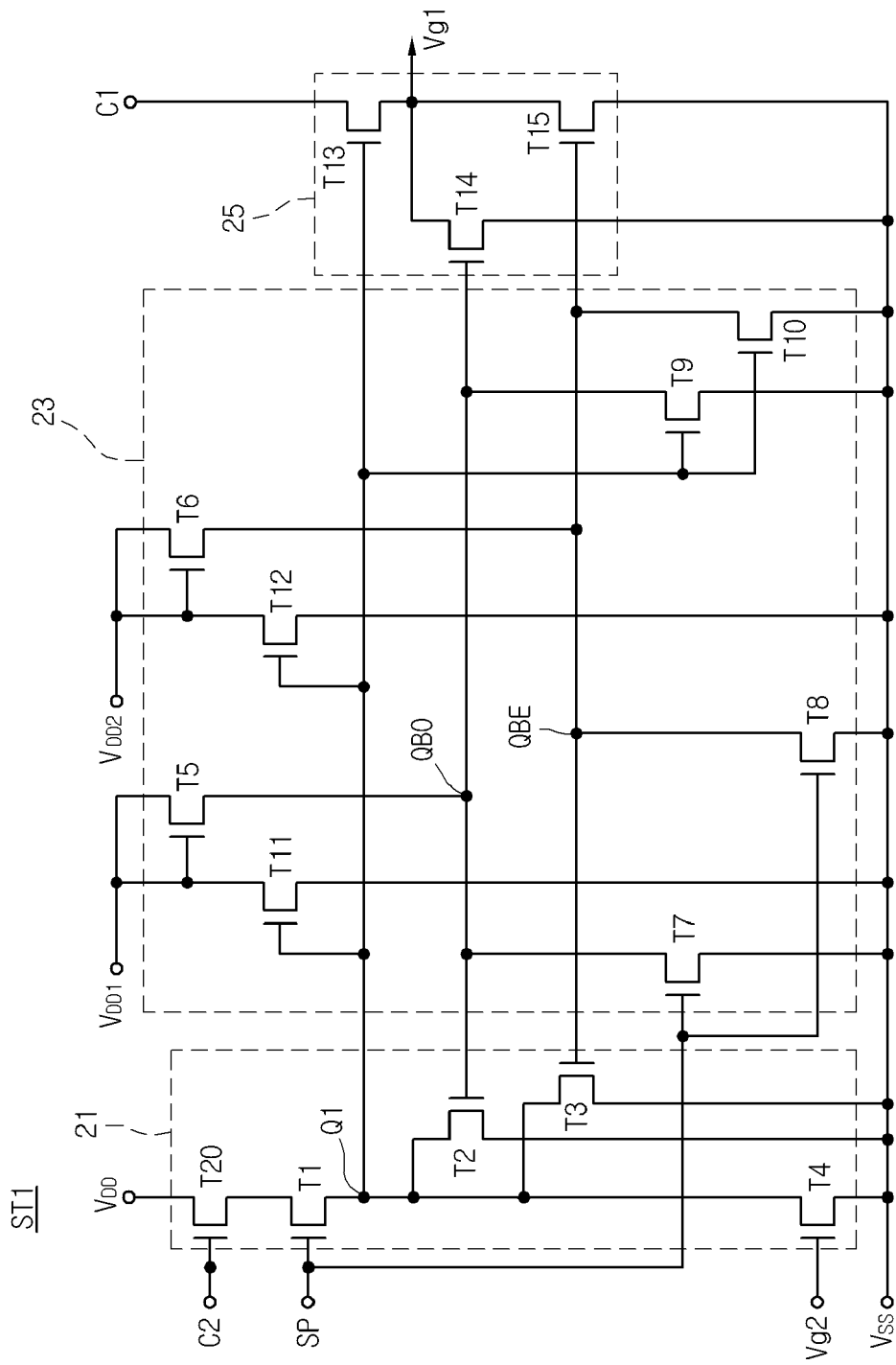
FIG. 12 is a circuit diagram of a stage of the gate driver according to another embodiment of the present invention.

FIG. 12 is a circuit diagram of a stage of a gate driver according to another embodiment of the present invention. FIG. 12 illustrates a first stage ST1 shown FIG. 11, in detail. The embodiment depicted in FIG. 12 is similar to the embodiment depicted in FIG. 7, but includes a twentieth transistor T20. The twentieth transistor T20 is controlled by a second clock signal C2 (for another example, the third clock signal C3 in the case of a 3-phase clock) prior to the first clock signal C1 that will be outputted. That is, the twentieth transistor T20 has a gate connected to the second clock signal C2, a source connected to the fourth power supply voltage VDD, and a drain connected to the source of the first transistor T1.

In this case, the second clock signal C2 is synchronized with the start pulse SP. That is, when the start pulse SP is a high logic level, the second clock signal C2 also becomes a high logic level. Therefore, when the start pulse SP and the second clock signal C2 are in a high logic level, the twentieth and first transistors T20 and T1 are turned on, so that the fourth power supply voltage VDD is supplied to the non-inverting node Q. Clocks of at least three phases are used and two of the clocks are inputted as the clock signal to each stage.

By adding the twentieth transistor T20, it is possible to prevent the fourth power supply voltage VDD from being supplied to the non-inverting node Q without regard to the start pulse SP.

According to an embodiment of the present invention, the gate driver can be driven with 3-phase clock signals C1 to C3 or with 4-phase clock signals C1 to C4. Then, the twentieth transistor T20 can be responsive to a third or a fourth clock signal C3 or C4. The third clock signal C3 out of the 3-phase clock signals and the fourth clock signal C4 out of the 4-phase clock signals will be enabled prior to the first clock signal C1 in logic high.

Figure 13:
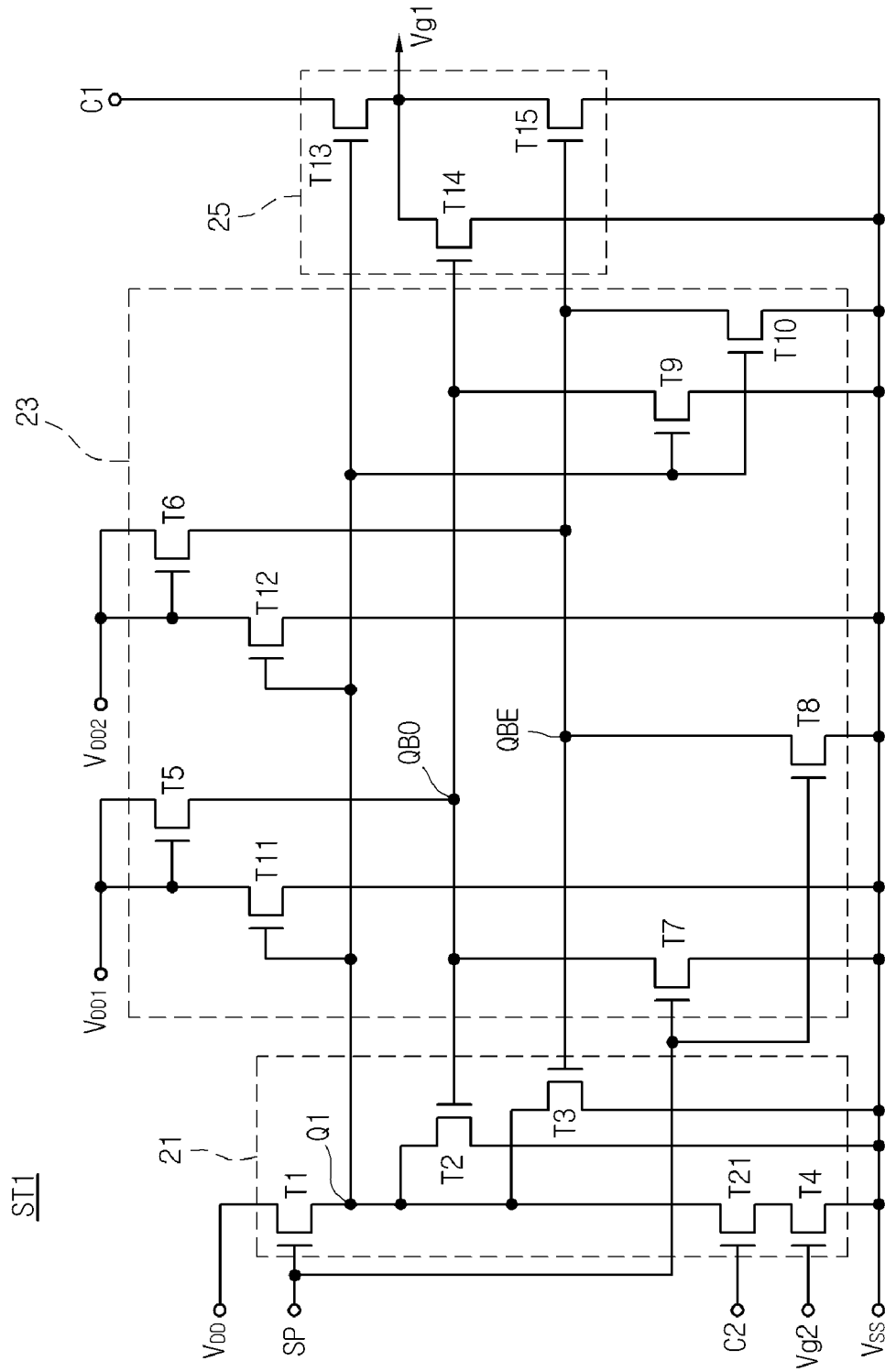
FIG. 13 is a circuit diagram of a stage of the gate driver according to another embodiment of the present invention.

FIG. 13 is a circuit diagram of a stage of a gate driver according to another embodiment of the present invention. FIG. 13 illustrates a first stage ST1 shown FIG. 11, in detail. FIG. 13 is similar to FIG. 7, but includes a twenty-first transistor T21. The twenty-first transistor T21 is controlled by a second clock signal C2 next to the first clock signal C1 that will be outputted. That is, the twenty-first transistor T21 has a gate connected to the second clock signal C2, a source connected to the first power supply voltage VSS, and a drain connected to the non-inverting node Q.

The scan signal Vg2 is outputted from the next stage ST2 by the second clock signal C2. Therefore, the second clock signal C2 is synchronized with the scan signal Vg2 of the next stage ST2. Therefore, when the second clock signal C2 and the scan signal Vg2 of the next stage ST2 are in a high logic level, the twenty-first and fourth transistors T21 and T4 are turned on, so that the first power supply voltage VSS is supplied to the non-inverting node Q.

By adding the twenty-first transistor T21, it is possible to prevent the first power supply voltage VSS from being supplied to the non-inverting node Q without regard to the scan signal Vg2 outputted from the next stage ST2.

Furthermore, although the gate driver receives 3-phase or 4-phase clock signals C1 to C3 or C1 to C4, the twenty-first transistor T21 responds to the second clock signal C2 of the 3-phase or 4-phase clock signals C1 to C3 or C1 to C4 because the second clock signal C2 is enabled next to the first clock signal C1 in logic high.

In accordance with an embodiment of the present invention, clocks of at least three phases are used and two of the clocks are inputted as the clock signal to each stage.

As described above, degradation can be prevented and a more stable operation can be achieved by supplying the periodically phase-inverted voltages to two transistors controlling the scan signal of the low logic level in each stage. Consequently, embodiments of the present invention can provide improved image quality and expanded lifetime.

The stages according to an embodiment of the present invention can be applied to the organic EL as well as the LCD.

It will be apparent to those skilled in the art that various modifications and variations can be made in the present invention. Thus, it is intended that the present invention covers the modifications and variations of this invention provided they come within the scope of the appended claims and their equivalent.

What is claimed is:

1. A gate driver using a multiple power supplies voltages and having a shift resister comprising a plurality of stages sequentially outputting shifted signals, each of the stages including:
   a first controller for controlling a first node voltage in response to an output signal from a previous stage and an output signal from a next stage;
   a second controller for controlling second and third nodes voltages in response to the output signal from the previous stage and the voltage at the first node; and
   an output unit for selectively outputting one of a plurality of clock signals and a first power supply voltage in response to the voltages at the first, second and third nodes,
   wherein second and third power supply voltages different from each other change their polarities at n frame periods(where n is a positive integer) and are supplied to the second and third nodes,
   wherein each of the second and third power supply voltages oscillates between a high voltage and a low voltage, and the second and third power supply voltages different from each other are switched be supplied to the second and third nodes,
   wherein the low voltage is lower than or equal to the voltage of the first power supply, wherein the high voltage is higher than the voltage of the first power supply, wherein the first controller comprises a first transistor for supplying a fourth power supply voltage to the first node in response to the output signal from the previous stage, a second transistor for supplying the first power supply voltage to the first node in response to the voltage at the second node, a third transistor for supplying the first power supply voltage to the first node in response to the voltage at the third node and a fourth transistor for supplying the first power supply voltage to the first node in response to the output signal of the next stage.

2. The gate driver using a multiple power supplies voltages and having a shift resister according to claim 1, wherein the first controller further comprises a fifth transistor connected to the first transistor to supply the fourth power supply voltage to the first node in response to a second clock leading the one of the plurality of clock signals.

3. The gate driver using a multiple power supplies voltages and having a shift resister according to claim 1, wherein the first controller further comprises a fifth transistor connected to the fourth transistor to supply the first power supply voltage to the first node in response to a second clock signal following the one of the plurality of clock signals.

4. The gate driver using a multiple power supplies voltages and having a shift resister according to claim 1, wherein the second controller comprises:
   a first transistor for supplying the second power supply voltage to the second node;
   a second transistor for supplying the third power supply voltage to the third node;
   a third transistor for supplying the first power supply voltage to the second node in response to the output signal of the previous stage;
   a fourth transistor for supplying the first power supply voltage to the third node in response to the output signal of the previous stage;
   a fifth transistor for supplying the first power supply voltage to the second node in response to the voltage at the first node; and
   a sixth transistor for supplying the first power supply voltage to the third node in response to the voltage at the first node.

5. The gate driver using a multiple power supp lies voltages and having a shift resister according to claim 4, wherein the second controller further comprises:
   a seventh transistor supplying the first power supply voltage to the first node for controlling the first transistor; and
   an eighth transistor supplying the first power supply voltage in response to the voltage at the first node for controlling the second transistor.

6. The gate driver using a multiple power supplies voltages and having a shift resister according to claim 5, wherein the first transistor is controlled by a difference between the second power supply voltage and the first power supply voltage passing through the seventh transistor.

7. The gate driver using a multiple power supplies voltages and having a shift resister according to claim 5, wherein the second transistor is controlled by a difference between the third power supply voltage inputted from the second transistor and the first power supply voltage passing through the eighth transistor.

8. The gate driver using a multiple power supplies voltages and having a shift resister according to claim 4, wherein the second controller further comprises:
   a seventh transistor supplying the first power supply voltage to the third node in response to the voltage at the second node;
   an eighth transistor supplying the first transistor voltage to the second node in response to the voltage at the third node;
   a ninth transistor supplying the second power supply voltage to the second node in response to the output signal of the next stage; and
   a tenth transistor supplying the third power supply voltage to the third node in response to the output signal of the next stage.

9. The gate driver using a multiple power supplies voltages and having a shift resister according to claim 4, wherein the second controller further comprises:
   a seventh transistor supplying the first power supply voltage to the third node in response to the voltage from the second power supply;
   an eighth transistor supplying the first power supply voltage to the second node in response to the voltage from the third power supply;
   a ninth transistor supplying the second power supply voltage to the second node in response to the output signal of the next stage; and
   a tenth transistor supplying the third power supply voltage to the third node in response to the output signal of the next stage.

10. The gate driver using a multiple power supplies voltages and having a shift resister according to claim 8, wherein one of the second and third nodes is rapidly discharged by a control of the seventh to tenth transistors.

11. The gate driver using a multiple power supplies voltages and having a shift resister according to claim 1, wherein the output unit comprises:
   a first transistor for outputting the one of the plurality of the clock signals in response to the voltage at the first node;
   a second transistor for outputting the first power supply voltage in response to the voltage at the second node; and
   a third transistor for outputting the first power supply voltage in response to the voltage at the third node.

12. The gate driver using a multiple power supplies voltages and having a shift resister according to claim 1, wherein the second and third power supply voltages are switched at n frame periods (where n is a positive integer).

13. The gate driver using a multiple power supplies voltages and having a shift resister according to claim 3, wherein only one clock among clock signals of at least two phases is inputted to the respective stages.

* * * * *